United States Patent
Sakinada et al.

(10) Patent No.: US 7,816,794 B2
(45) Date of Patent: Oct. 19, 2010

(54) ELECTRONIC DEVICE AND METHOD OF FABRICATING THE SAME

(75) Inventors: Kaoru Sakinada, Suzaka (JP); Takumi Kooriike, Suzaka (JP); Shunichi Aikawa, Suzaka (JP); Osamu Kawachi, Yokohama (JP); Yasufumi Kaneda, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 11/314,007

(22) Filed: Dec. 22, 2005

(65) Prior Publication Data

US 2006/0138672 A1 Jun. 29, 2006

(30) Foreign Application Priority Data

Dec. 24, 2004 (JP) .............................. 2004-374596
Mar. 1, 2005 (JP) .............................. 2005-056722

(51) Int. Cl.
*H01L 23/29* (2006.01)

(52) U.S. Cl. .................. 257/790; 257/660; 257/778; 257/783; 257/787; 257/788; 438/108; 438/110; 438/127

(58) Field of Classification Search .................. 257/666, 257/704, 723, 737–738, 787–790, 781–784, 257/778–779, 795, 706, 712, 772, 707, 713, 257/780, 791, E23.114, 660; 361/760–764, 361/742–743, 758, 770, 804, 782, 783, 765, 361/766, 767; 438/110, 127, 108
See application file for complete search history.

(56) References Cited

U.S. PATENT DOCUMENTS

| | | | | |
|---|---|---|---|---|
| 5,684,677 A * | 11/1997 | Uchida et al. ............... | 361/770 |
| 5,821,161 A * | 10/1998 | Covell et al. ............... | 438/613 |
| 6,882,041 B1 * | 4/2005 | Cheah et al. ............... | 257/704 |
| 6,982,380 B2 * | 1/2006 | Hoffmann et al. ............ | 174/520 |
| 7,224,066 B2 * | 5/2007 | Naruse et al. ............... | 257/772 |
| 2004/0100164 A1 * | 5/2004 | Murata et al. ............... | 310/348 |
| 2004/0113215 A1 | 6/2004 | Shimada et al. | |
| 2005/0121785 A1 * | 6/2005 | Stelzl et al. ............... | 257/738 |
| 2005/0146021 A1 * | 7/2005 | Edwards ...................... | 257/704 |
| 2006/0061974 A1 * | 3/2006 | Soga et al. ................... | 361/743 |
| 2006/0151203 A1 * | 7/2006 | Krueger et al. ............... | 174/260 |
| 2006/0231933 A1 * | 10/2006 | Cabahug et al. ............. | 257/666 |
| 2006/0273467 A1 * | 12/2006 | Brandenburg et al. ....... | 257/778 |

FOREIGN PATENT DOCUMENTS

CN 1476166 A 2/2004
JP 04-032251 2/1992

(Continued)

OTHER PUBLICATIONS

Office Action dated Jul. 14, 2009, 4 pages.

*Primary Examiner*—Thao X Le
*Assistant Examiner*—Thanh Y Tran
(74) *Attorney, Agent, or Firm*—Arent Fox LLP

(57) ABSTRACT

An electronic device includes a package substrate made of an insulator, a device chip that is flip-chip mounted on the package substrate, and a seal portion sealing the device chip. The seal portion includes sidewalls made of solder. The whole seal portion including the sidewalls may be made of solder. The electronic device may include a metal layer provided on the seal portion.

13 Claims, 15 Drawing Sheets

FOREIGN PATENT DOCUMENTS

| | | |
|---|---|---|
| JP | 2004-032251 | 2/1992 |
| JP | 7-111438 A | 4/1995 |
| JP | 10-163374 A | 6/1998 |
| JP | 2001-53577 A | 2/2001 |
| JP | 2001-110946 A | 4/2001 |
| JP | 2004-129193 A | 4/2004 |
| JP | 2004-207674 | 7/2004 |
| WO | 97/02596 A1 | 1/1997 |

* cited by examiner

ELECTRONIC DEVICE AND METHOD OF FABRICATING THE SAME

BACKGROUND OF THE INVENTION

1. Field of the Invention

The present invention relates to an electronic device and a method of fabricating the same, and more particularly, to the technique of packaging a device chip on a package substrate in flip-chip mounting.

2. Description of the Related Art

Conventionally, wire bonding is used to make mechanical and electrical connections between a chip of an electronic device and a package. In wire bonding, the device chip is mechanically connected to the package by an adhesive, and is electrically connected thereto by metal wires. Recently, the mainstream connection method is flip-chip bonding in which bumps are used to connect the chip and the package.

FIG. 12 shows a conventional art described in Japanese Patent Application Publication No. 2001-53577 (hereinafter simply referred to as Document 1) or Japanese Patent Application Publication No. 2001-110946 (Document 2). FIG. 12 shows a typical structure of an electronic device fabricated by flip-chip bonding. The electronic device has such a basic structure that bumps 2 are provided on a device chip 1 by using metal wires, and the device chip 1 with the bumps 2 is mounted on a wiring pattern 4 provided on a main surface of a ceramic package substrate 3 by a flip-chip bonder. The bumps 2 are bonded to the wiring pattern 4. This bonding makes mechanical and electrical connections between the device chip 1 and the package substrate 3. Then, a metal lid 10 is used to hermetically seal the device chip 1 in the final step of fabricating the electronic device. A seal solder layer 5 and a package-side seal pattern 6 are interposed between the package substrate 3 and the lid 10. The device 10 has a hollow portion 8, and an electrode pattern 9.

FIG. 13 shows another conventional art described in International Publication WO97/02596 (Document 3). The device chip 1 and the package substrate 3 are mechanically and electrically connected together in the same manner as that used for the device 10 shown in FIG. 12. Then, seal resin 11 is used to establish sealing and form an external shape so that the electronic device is completed.

FIG. 14 shows yet another conventional art described in Japanese Patent Application Publication No. 2004-129193 (Document 4). The device chip 1 and the package substrate 3 are mechanically and electrically connected together in the same manner as that used for the device shown in FIG. 12. During the process, the seal solder 5 are formed on the main surface of the package substrate 3 beforehand, and sealing is simultaneously performed. Then, the seal resin 11 is used to form the outer shape of the electronic device so that the electronic device is completed.

The conventional arts mentioned above that use flip-chip bonding to connect the device chip and the package substrate have a possibility that a foreign object may contact the electrode pattern 9 formed on the chip surface or moisture may enter into the contact so that the device does not function. Particularly, the above problem is serious to acoustic filters that use an elastic wave, such as surface acoustic wave (SAW) devices and film bulk acoustic resonators (FBARs). It is thus essential to hermetically seal the hollow region to protect the electrode pattern 9 from outside air.

However, the conventional arts have the respective drawbacks mentioned below. The device shown in FIG. 12 employs the metal lid 10 and the seal solder 5 to realize high hermetic seal and strong outer shape. However, the package substrate is required to have sidewalls, which prevents downsizing, reduced height and cost reduction of the device.

The device shown in FIG. 13 employs the seal resin 11, which may contribute to downsizing and height reduction. However, the device does not have good hermetic seal and comparatively low reliability. Further, the device may be liable to be affected by external waves because the entire chip is not shielded by metal. Particularly, poor shield may cause degraded performance of high-frequency (RF) components.

The device shown in FIG. 14 may overcome the drawbacks of the conventional devices shown in FIGS. 12 and 13 and is characterized in that the chip is sealed with the seal solder layer 5, and is then sealed with the resin 11. However, the device uses the two different materials for sealing and forming the outer shape, and has a problem in terms of the cost. It is also required to form the seal solder layer on the package substrate beforehand. This may produce devices having errors in shape and limit the time for thermal treatment. Mass productivity may be improved by flip-chip mounting chips on a sheet-shaped multi-production substrate and by simultaneously performing soldering. In this process, the whole sheet-shaped substrate is inevitably heated up to 300° C. or higher for a couple of minutes. This thermal treatment causes the metal layer mounted on the device chip and the package substrate and adapt to solder to be melted in solder, and degrades the reliability.

SUMMARY OF THE INVENTION

The present invention has been made in view of the above circumstances and provides a compact, height-reduced, less-expensive and reliable electronic device and a method of fabricating the same.

According to an aspect of the present invention, there is provided an electronic device including: a package substrate made of an insulator; a device chip that is flip-chip mounted on the package substrate; and a seal portion sealing the device chip, the seal portion being sidewalls made of solder.

According to another aspect of the present invention, there is provided a method of fabricating an electronic device comprising the steps of: flip-chip mounting a device chip on a package substrate; and supplying solder to at least one of the package substrate and the device chip and heating the solder to be melted so that a seal portion made of solder is formed on the package substrate.

According to a further aspect of the present invention, there is provided a method of fabricating an electronic device comprising the steps of: flip-chip mounting device chips on a package substrate; and supplying solder to at least one of the package substrate and the device chips and heating the solder to be melted so that a seal portion made of solder is formed on the package substrate so as to cover the device chips.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of preferred embodiments of the present invention.

First Embodiment

Figure 1:
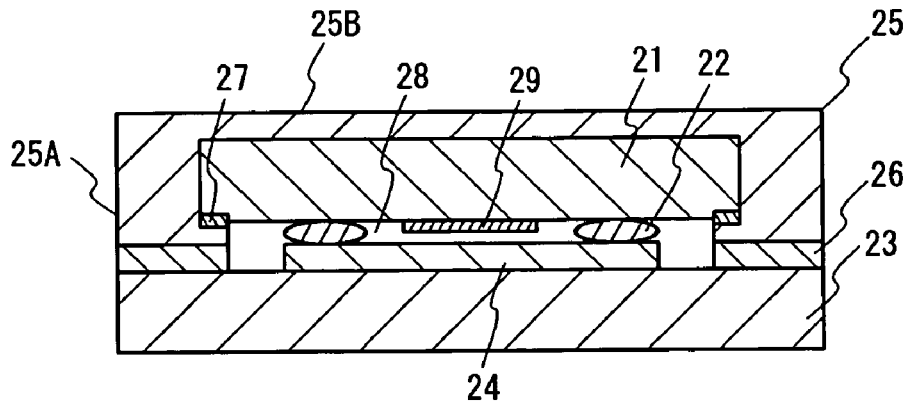
FIG. 1 is a cross-sectional view of an electronic device in accordance with a first embodiment of the present invention.

FIG. 1 is a cross-sectional view of an electronic device in accordance with a first embodiment of the present invention.

The device has a device chip 21 and a package substrate 23, which are electrically and mechanically connected by bumps 22 made of Au or an alloy including Au. The device chip 21 has desired electrical characteristics. The package substrate 23 is made of an insulator such as resin or ceramics. A wiring pattern 24 is formed on an upper surface of the package 23. The device chip 21 is flip-chip mounted on the wiring pattern 24 through the bumps 22 in the facedown state. The device chip has an electrode pattern 29, which may be an interdigital transducer (comb-like electrodes) of a surface acoustic wave device. The device chip 21 has not-shown pads, on which the bumps 22 are provided. The device chip 21 and the package substrate 23 are sealed with a seal portion 25 made of solder. The solder seal portion 25 covers the whole chip, and defines an outer shape of the electronic device. The solder seal portion 25 forms the package of the electronic device along with the package substrate 23. The solder seal portion 25 forms side portions 25A and an upper portion 25B. The side and upper surfaces of the package are formed by solder of the solder seal portion 25. The solder seal portion 25 forms a cavity (hollow portion) 28 within the package. The device chip 21 is hermetically sealed within the cavity 28. The peripheral portions of the device chip 21 and those of the package substrate 23 are respectively provided with a chip-side seal pattern 27 and a package-side seal pattern 26, which patterns are made of metal and are provided in corresponding positions. The chip-side seal pattern 27 overlaps with a part of the package-side seal pattern 26. In the fabrication process, the seal patterns 26 and 27 function as areas for facilitating flow of solder for forming the solder seal portion 25. Thus, an end portion of the solder seal portion 25 is bonded to the package-side seal pattern 26 and the chip-side seal pattern 27, and slightly protrudes to the cavity 28. The package-side seal pattern 26 and the chip-side seal pattern 27 are made of a metal having a good wettability to solder. The seal patterns 26 and 27 may be a single layer of metal or may be compose of multiple layers made of different metals. For example, the patterns 26 and 27 may have a two-layer structure composed of a Ni layer and an Au layer.

As described above, the first embodiment of the present invention seals the whole device chip 21 with the solder seal portion 25 joined to the package substrate 23. The electronic device thus configured has high airtightness, excellent electrical shielding, reliable bonding, a substantial outer shape, and a reduced height. As will be described later, the present electronic device may be fabricated by a simple process, and is thus less expensive.

The solder seal portion 25 may be made of Sn—Ag solder. Another arbitrary solder may be used as the solder seal portion 25.

Second Embodiment

Figure 2:
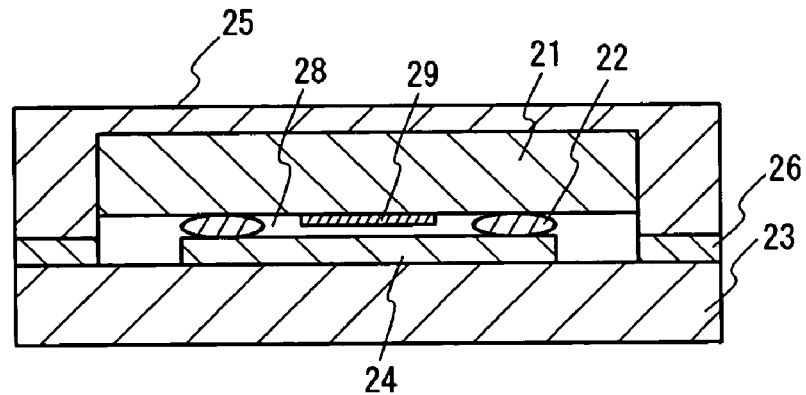
FIG. 2 is a cross-sectional view of an electronic device in accordance with a second embodiment of the present invention.

FIG. 2 is a cross-sectional view of an electronic device in accordance with a second embodiment of the present invention, in which parts that are the same as those shown in FIG. 1 are given the same reference numerals as previously. The solder seal portion 25 seals the whole device chip 21 as the solder seal portion 25 shown in FIG. 1. The structure shown in FIG. 2 does not have the chip-side seal pattern 27 shown in FIG. 1 and a shape such that the outer size of the device chip 21 is substantially equal to the inside dimension of the package-side seal pattern 26. This prevents the fluidized seal solder 25 from flowing along the backside of the device chip 21 and forms the shape shown in FIG. 2 having the sealed hollow region. In the second embodiment, the whole device chip 21 is sealed by the solder seal portion 25 bonded to the package substrate 23. The electronic device thus configured has high airtightness, excellent electrical shielding, reliable bonding, a substantial outer shape and a reduced height.

Third Embodiment

Figure 3:
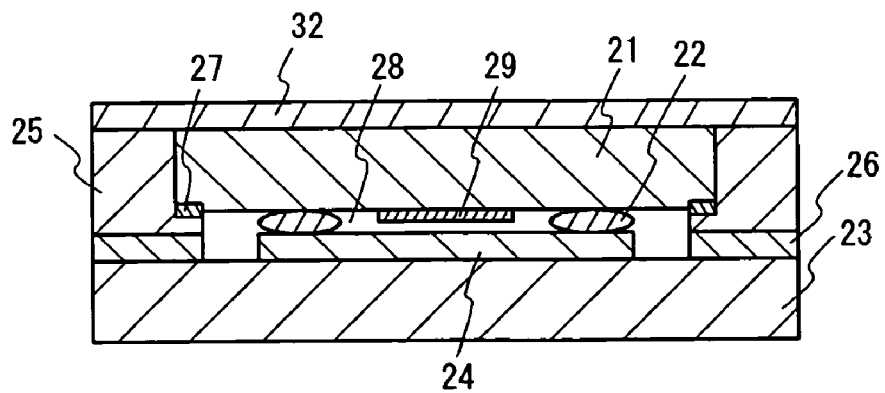
FIG. 3 is a cross-sectional view of an electronic device in accordance with a third embodiment of the present invention.

FIG. 3 is a cross-sectional view of an electronic device in accordance with a third embodiment of the present invention, in which parts that are the same as those shown in FIG. 1 are given the same reference numerals as previously. The electronic device of the third embodiment has a structure in which a metal layer 32 is provided on the solder seal portion 25 provided along the peripheral portions of the device chip 21. That is, the combination of the solder seal portion 25 and the metal layer 32 defines the seal portion on the package substrate 23. The metal layer 32 may be made of a kovar alloy. The metal layer 32 functions to protect the entire electronic device and an auxiliary structural member for solder. The kovar alloy has a thermal expansion coefficient close to that of ceramics, and thus functions to absorb the difference in thermal expansion coefficient between a piezoelectric substrate such as a SAW chip and ceramics of the package substrate 23. It is therefore possible to prevent considerable stress from being applied to the SAW chip of the completed electronic device and greatly improve the reliability and electrical performance. Of course, the third embodiment has the same advantages as those of the first embodiment.

Fourth Embodiment

Figure 4:
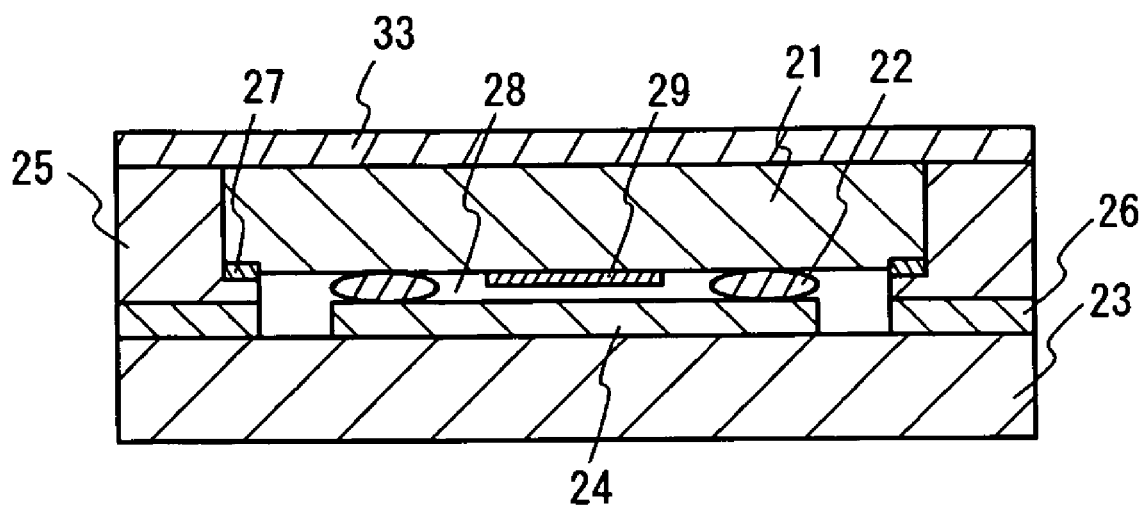
FIG. 4 is a cross-sectional view of an electronic device in accordance with a fourth embodiment of the present invention.

FIG. 4 is a cross-sectional view of an electronic device in accordance with a fourth embodiment of the present invention, in which parts that are the same as those shown in FIG. 1 are given the same reference numerals as previously. The electronic device of the fourth embodiment has a structure in which a resin layer 33 is provided on the solder seal portion 25 provided on the peripheral portions of the device chip 21. The combination of the solder seal portion 25 and the resin layer 33 defines the seal region on the package substrate 23. The resin layer 33 may be a sheet-like polyamide layer (having a Cu wiring pattern on an either side thereof). This film for the resin layer 33 may be substituted for a glass-epoxy film layer.

Fifth Embodiment

Figure 5A:
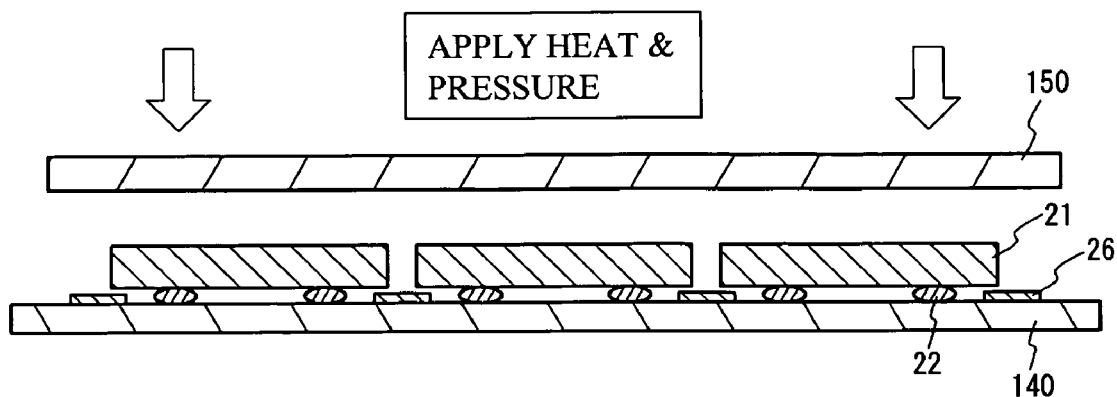
FIGS. 5A through 5C show a method of fabricating an electronic device in accordance with a fifth embodiment of the present invention.
Figure 5B:
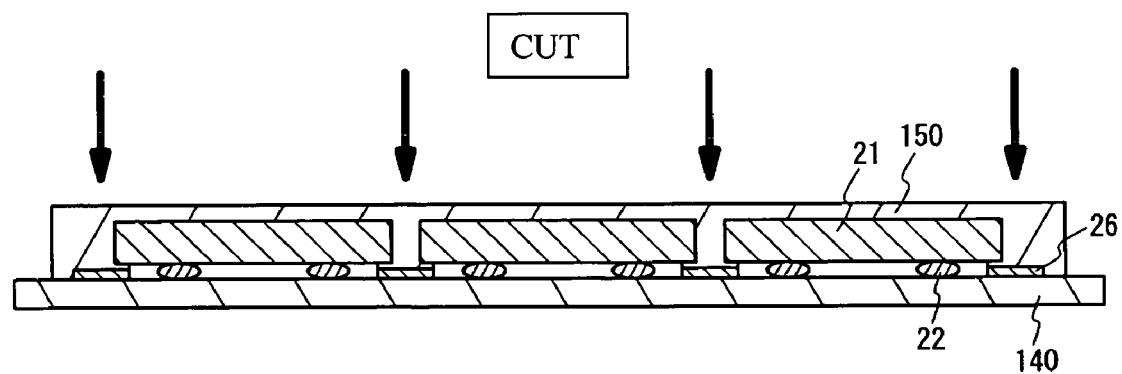
Figure 5C:
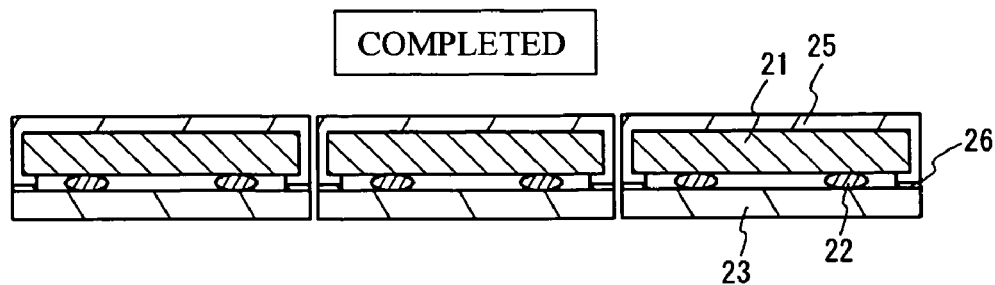

FIGS. 5A through 5C show a process of fabricating an electronic device in accordance with a fifth embodiment of the present invention. More specifically, the fifth embodiment is the method of fabricating the electronic devices that have the structure of the first or second embodiment. Referring to FIG. 5A, multiple device chips 21 are mounted on a multiple package substrate 140 in rows and columns, and are flip-chip bonded thereto. Next, a Sn—Ag solder sheet 150 is positioned on the device chips 21. Then, the solder sheet 150 is heated and pressurized from the upper side of the solder sheet 150. This process may be performed at a temperature necessary to melt solder and under a pressure necessary to form the outer shape of the package. The solder portions interposed between the device chips 21 bond the package-side seal patterns 26 and the not-shown chip-side seal patterns 27 (for the first embodiment) together. This bonding may be performed in a nitrogen atmosphere at a temperature of approximately 270° C. This results in the package substrate 140 on which the side and upper surfaces of the device chips 21 are covered with solder, as shown in FIG. 5B. Finally, the package substrate 140 is cut into the individual pieces by a dicer or the like, so that multiple electronic devices are available.

Sixth Embodiment

Figure 6A:
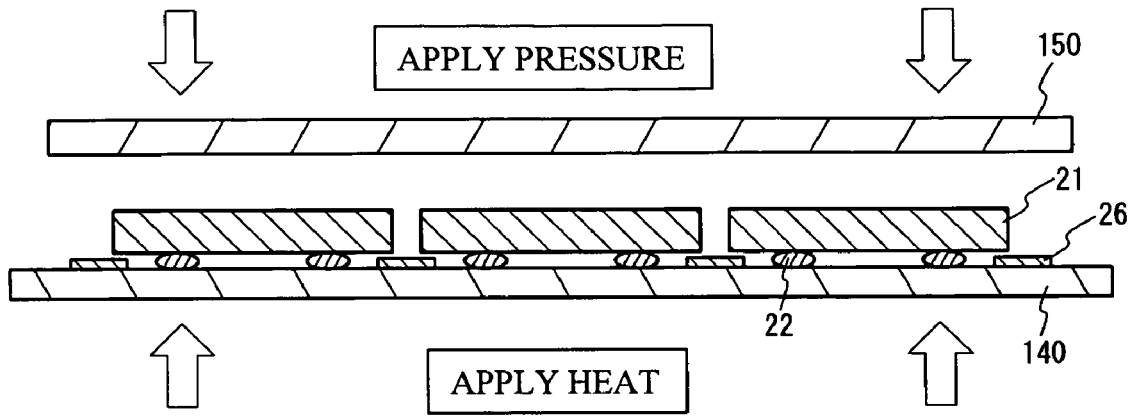
FIGS. 6A through 6C show a method of fabricating an electronic device in accordance with a sixth embodiment of the present invention.
Figure 6B:
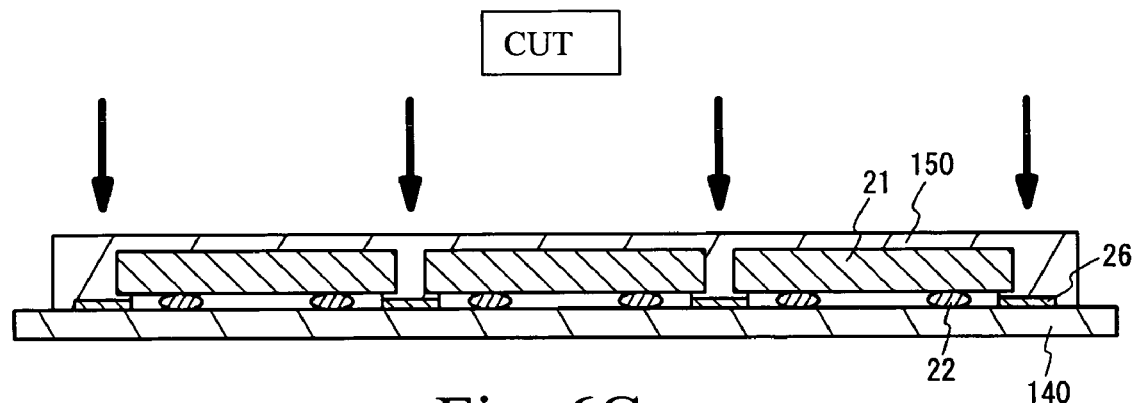
Figure 6C:
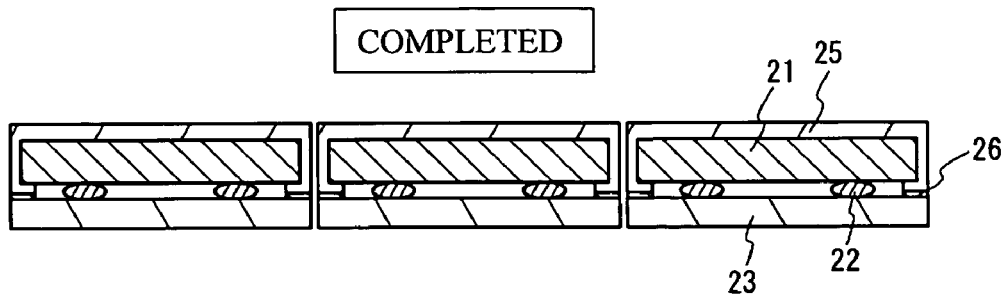

FIGS. 6A through 6C show a process of fabricating an electronic device in accordance with a sixth embodiment of the present invention. This process fabricates the electronic devices of the first or second embodiment. The present process differs from the fifth embodiment in that the package substrate 140 is heated from the backside thereof beforehand, and the sheet 150 is placed on the device chips 21 with a pressure being applied thereto from the upper sides thereof. The steps of FIGS. 6B and 6C are similar to those of FIGS. 5B and 5C. The electronic device of the second embodiment may be fabricated in the same manner as shown in FIGS. 6A through 6C.

Seventh Embodiment

Figure 7A:
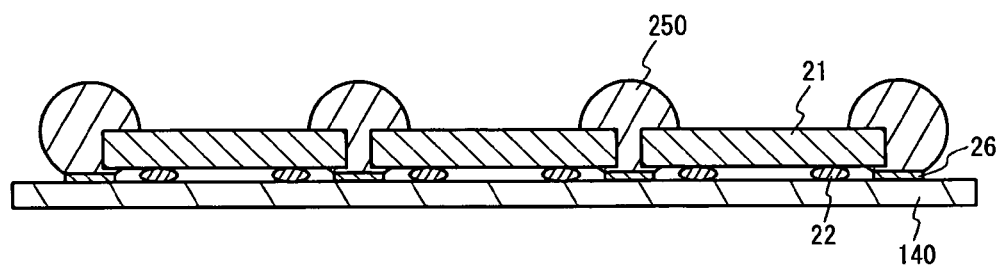
FIGS. 7A through 7C show a method of fabricating an electronic device in accordance with a seventh embodiment of the present invention.
Figure 7B:
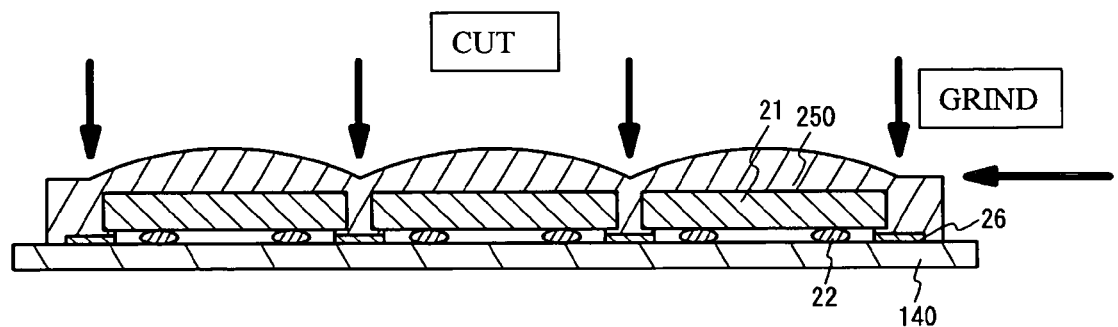
Figure 7C:
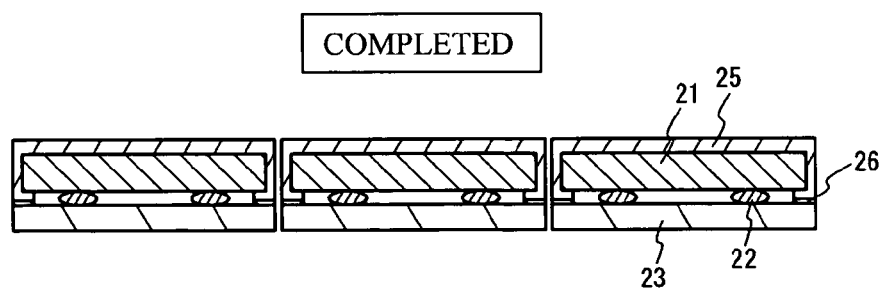

FIGS. 7A through 7C show a process of fabricating an electronic device in accordance with a seventh embodiment of the present invention. This process fabricates the electronic devices of the first or second embodiment. As shown in FIG. 7A, solder paste members 250 are provided in the gaps defined by the neighboring device chips 21, and are reflown. Next, as shown in FIG. 7B, the solder paste members 250 are grinded, and the package substrate 140 is cut into pieces by the dicer. Thus, multiple electronic devices of the first embodiment are available, as shown in FIG. 7C.

Eighth Embodiment

Figure 8A:
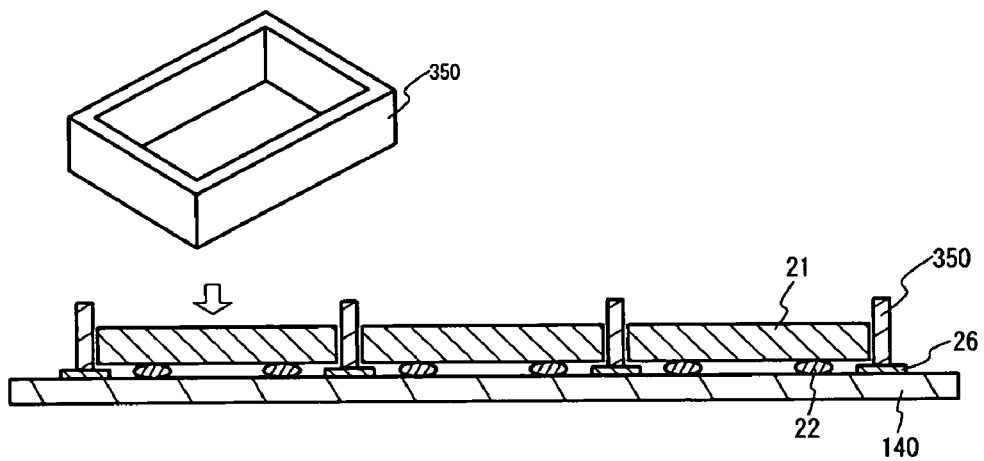
FIGS. 8A through 8C show a method of fabricating an electronic device in accordance with an eighth embodiment of the present invention.
Figure 8B:
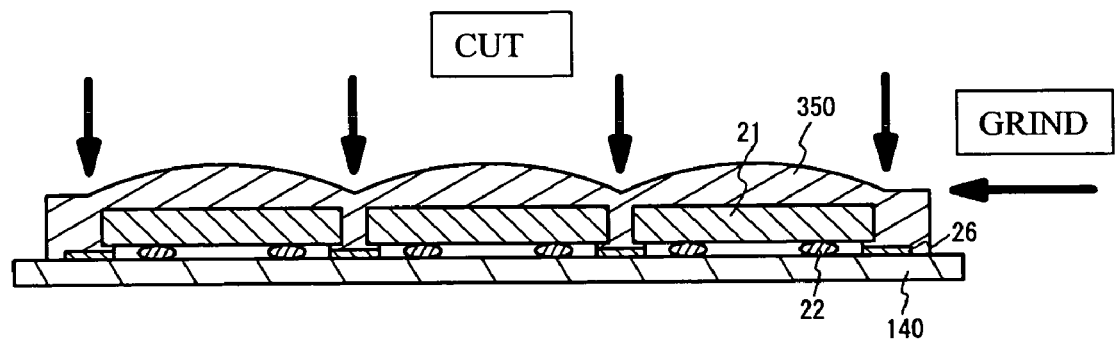
Figure 8C:
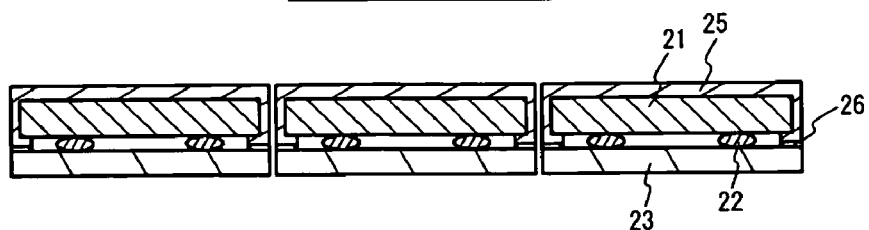

FIGS. 8A through 8C show a process of fabricating an electronic device in accordance with an eight embodiment of the present invention. This process fabricates the electronic devices of the first or second embodiment. As shown in FIG. 8A, washers 350 are provided so that each of the device chips 21 on the package substrate 140 is inserted into the respective washers 350. The washers are made of solder and are formed into a frame. The washers 350 may be applied to some of the devices chips 21. For example, the washers 350 may be alternately applied to the device chips 21 in an X or Y direction or both the directions. The subsequent steps of FIGS. 8B and 8C are the same as those of FIGS. 7B and 7C. The washers 350 may be substituted for a solder sheet having openings arranged in rows and columns. The device chips 21 are inserted into the openings of the solder sheet, which is then reflown.

Ninth Embodiment

Figure 9A:
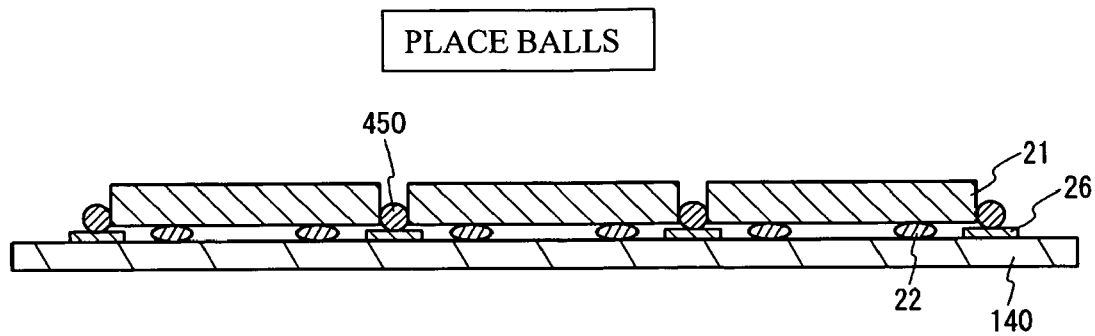
FIGS. 9A through 9C show a method of fabricating an electronic device in accordance with a ninth embodiment of the present invention.
Figure 9B:
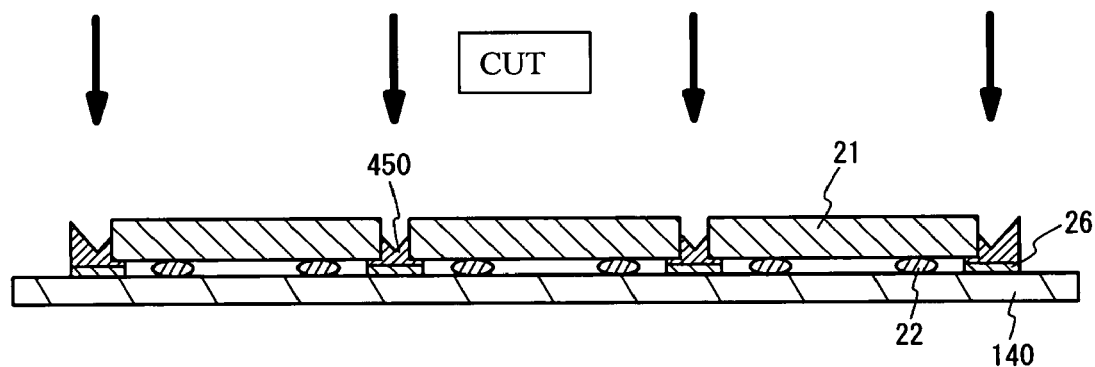
Figure 9C:
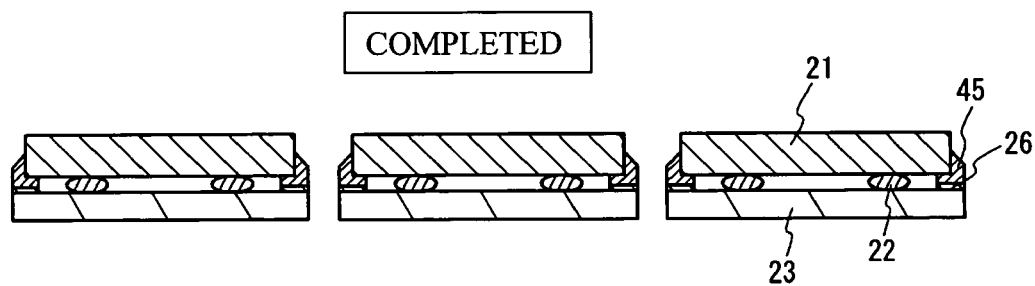

FIGS. 9A through 9C show a process of fabricating an electronic device in accordance with a ninth embodiment of the present invention. As shown in FIG. 9A, the present embodiment employs solder balls 450 for the solder paste members 250 used in the seventh embodiment. The solder balls 450 are placed in the gaps defined by the neighboring device chips 21 and are then reflown. The package substrate 140 after reflow is shown in FIG. 9B. The package substrate 140 is cut into the pieces by the dicer. Thus, as shown in FIG. 9C, multiple electronic devices are available in which the device chips 21 are sealed with packages having side portions 45 made of solder. The present device chips do not have any solder package provided on the device chips 21.

Tenth Embodiment

Figure 10A:
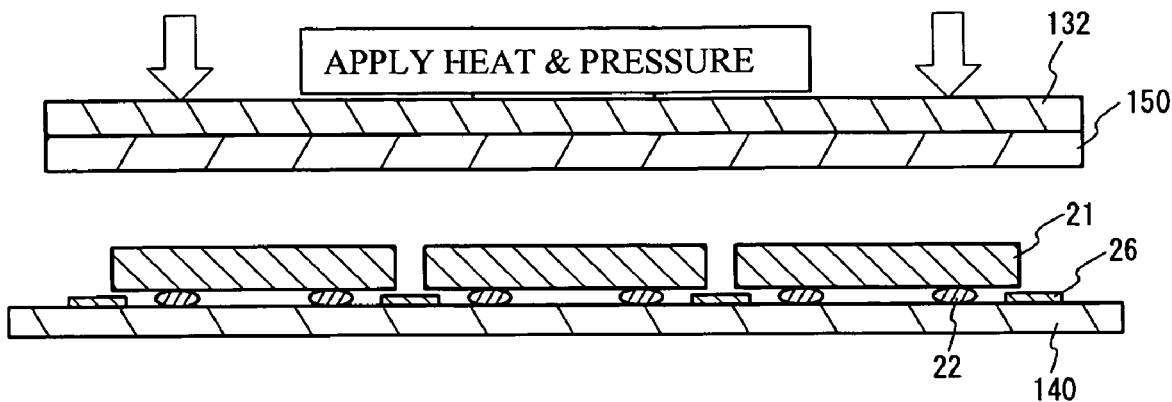
FIGS. 10A through 10C show a method of fabricating an electronic device in accordance with a tenth embodiment of the present invention.
Figure 10B:
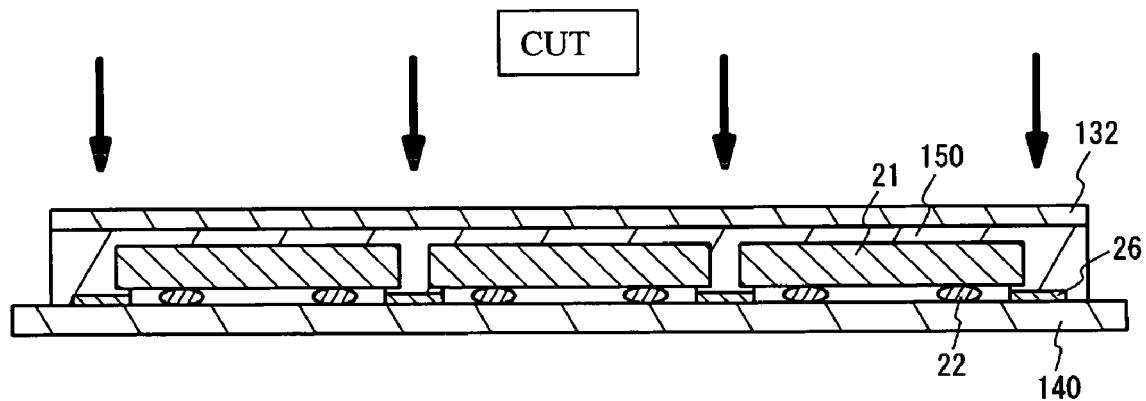
Figure 10C:
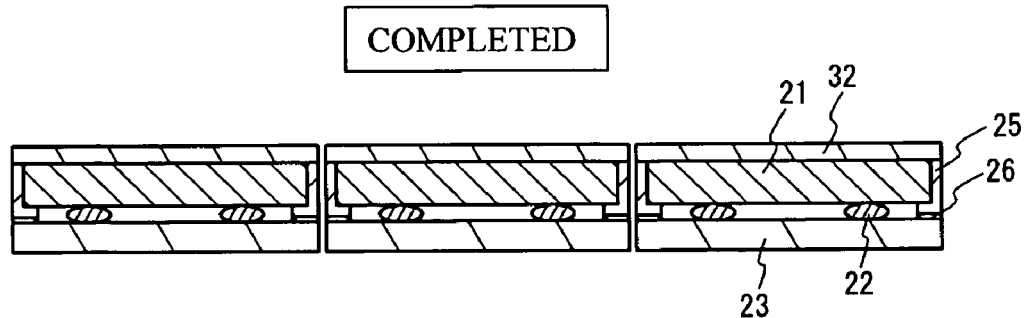

FIGS. 10A through 10C show a process of fabricating an electronic device in accordance with a tenth embodiment of the present invention. The present process fabricates the electronic devices of the third embodiment. Referring to FIG. 10A, a metal layer 132 is placed on the solder sheet 150, and the laminate thus formed is placed on the device chips 21 on a package substrate 140. Next, the laminate is heated and pressurized from the upper side of the metal layer 132. This process may be performed at a temperature necessary to melt solder and under a pressure necessary to form the outer shape of the package. The solders that enter into the gaps between the neighboring device chips 21 bond the package-side seal patterns 26 and the not-shown chip-side seal patterns 27 (for the first embodiment). Thus, as shown in FIG. 10B, the metal layer 132 are provided above the device chips 21 on the package substrate 140 via the solder layer, and the side and upper surfaces of the device chips 21 are covered with solder. The package substrate 140 thus formed is cut into pieces by the dicer, so that multiple electronic devices of the third embodiment can be produced, as shown in FIG. 10C. In the step of FIG. 10A, the package substrate 140 may be heated beforehand, as shown in FIG. 6A.

Eleventh Embodiment

Figure 11A:
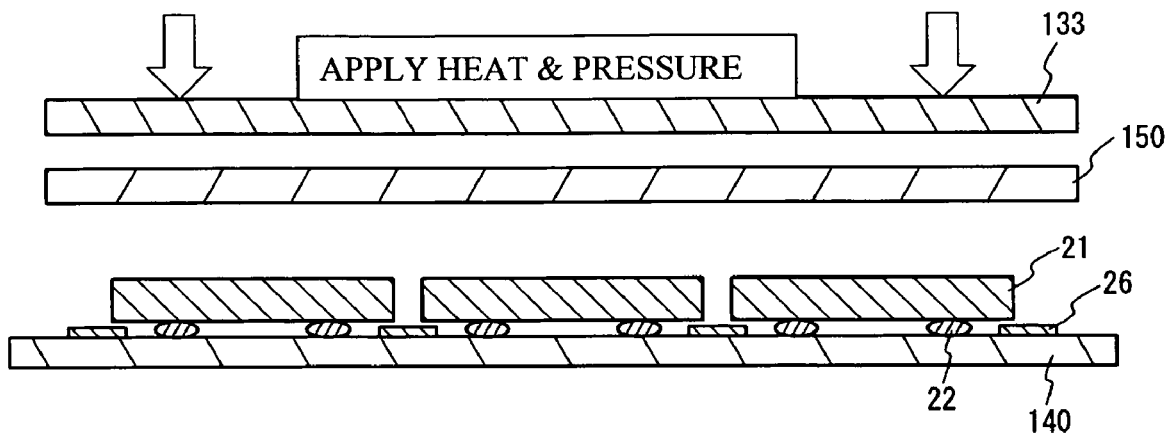
FIGS. 11A through 11C show a method of fabricating an electronic device in accordance with an eleventh embodiment of the present invention.
Figure 11B:
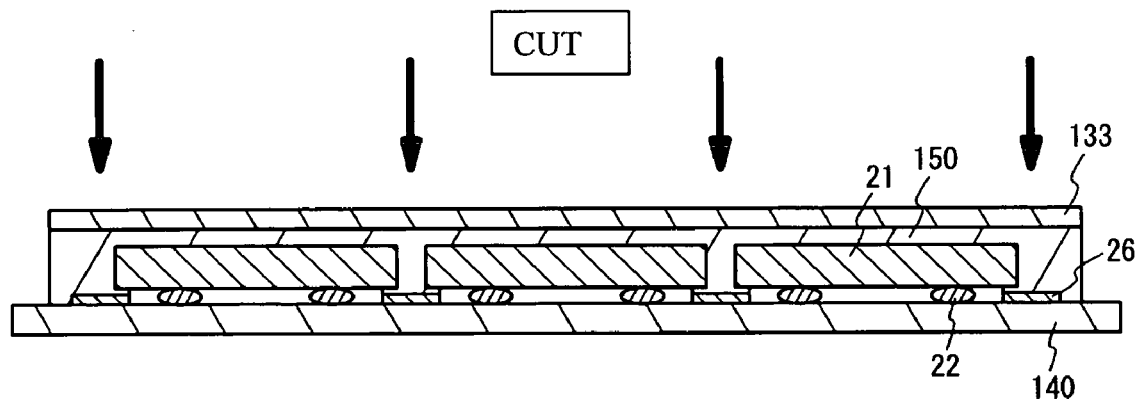
Figure 11C:
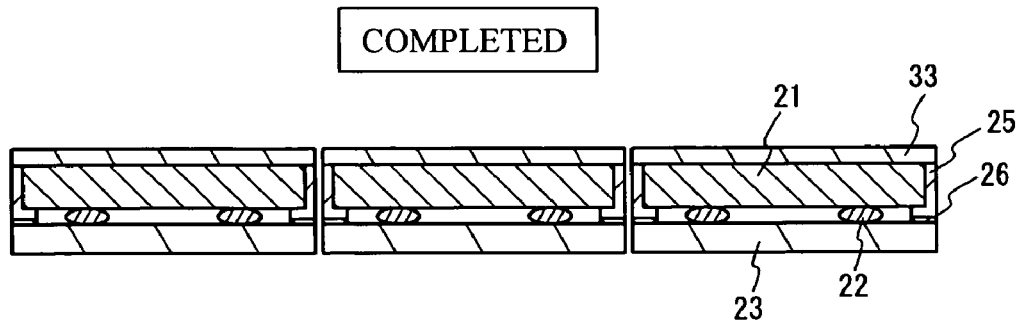
Figure 12:
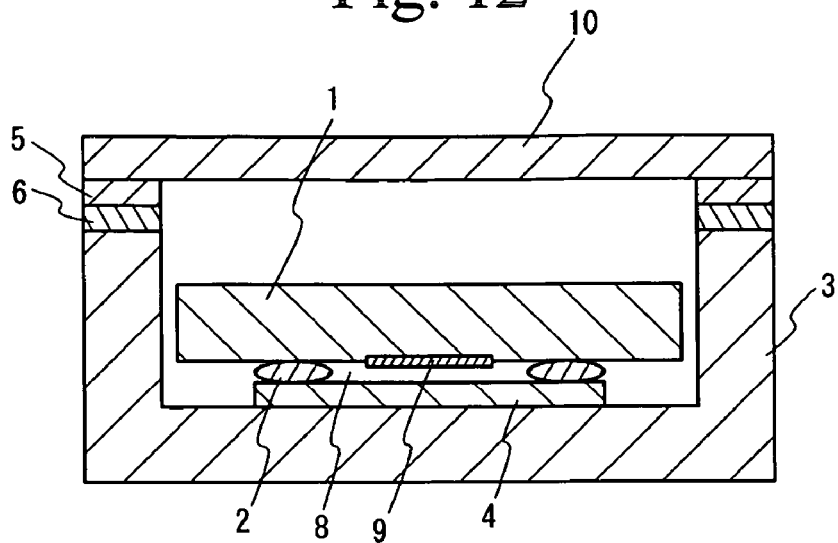
FIG. 12 is a cross-sectional view of a conventional electronic device.
Figure 13:
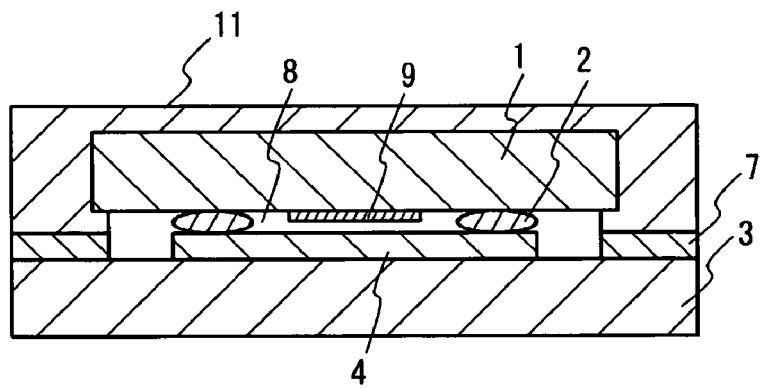
FIG. 13 is a cross-sectional view of another conventional electronic device.
Figure 14:
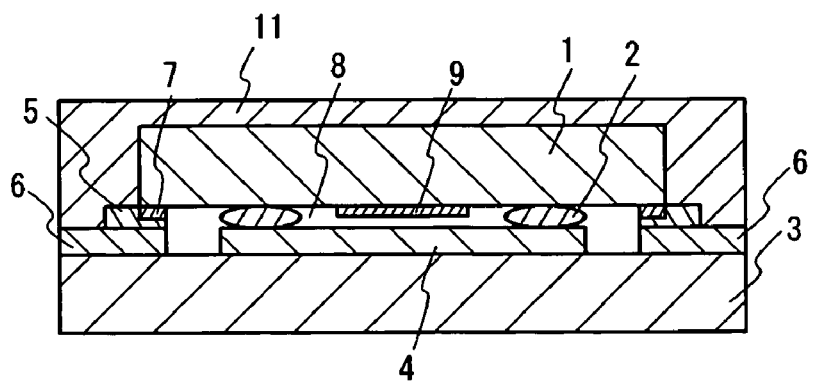
FIG. 14 is a cross-sectional view of yet another conventional electronic device.

FIGS. 11A through 11C shows a process of fabricating an electronic device in accordance with an eleventh embodiment of the present invention. The present process fabricates the electronic devices of the fourth embodiment. Referring to FIG. 11A, a resin layer 133, which may be a polyamide layer, is placed on the solder sheet 150, and the laminate thus formed is placed on the device chips 21. The laminate is heated and pressurized from the upper side of the resin layer 133. This process may be performed at a temperature necessary to melt solder and under a pressure necessary to form the outer shape of the package. The solders that enter into the gaps between the neighboring device chips 21 bond the package-side seal patterns 26 and the not-shown chip-side seal patterns 27 (for the first embodiment). Thus, as shown in FIG. 11B, the resin layer 133 are provided above the device chips 21 on the package substrate 140 via the solder layer, and the side and upper surfaces of the device chips 21 are covered with solder. The package substrate 140 thus formed is cut into pieces by the dicer, so that multiple electronic devices of the fourth embodiment FIG. 11A, the package substrate 140 may be heated beforehand, as shown in FIG. 6A.

Twelfth Embodiment

A twelfth embodiment of the present invention has a structure in which a protection film is provided to the electronic devices of the first through fourth embodiments of the present invention.

Figure 15:
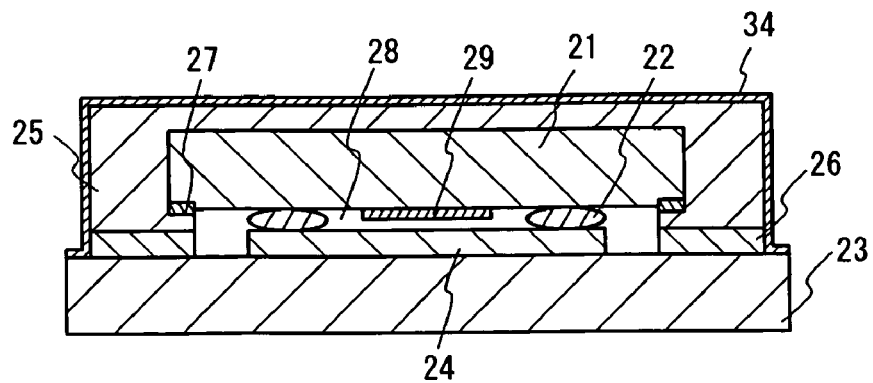
FIG. 15 is a cross-sectional view of an electronic device in accordance with a twelfth embodiment of the present invention, which is a variation of the electronic device in accordance with the first embodiment.

FIG. 15 is a cross-sectional view of an electronic device having a protection film 34 provided to the electronic device of the first embodiment. The protection film 34 covers the whole surface of the seal portion 25 and covers the package-side seal pattern 26 and the surface of the package substrate 23. That is, the protection film 34 hermetically seals the cavity 28. The protection film 34 may be a metal film or a resin film (insulation film). For the metal film, Ni is deposited to a thickness of 10 to 20 μm by electrolytic plating to thus form the protection film 34. Instead of Ni, a plating film of Cu or a vapor deposition film may be used as the protection film 34. The protection film 34 prevents the solder seal portion 25 inside the protection film 34 from being deformed due to external force or heat, and improves the heat-resistant temperature of the electronic device. Ni plating totally covers the solder portions, and prevent the performance and external appearance of the electronic device from being damaged even when the electronic device has a reflow profile over the melting point of solder. The resin used for the protection film 34 may, for example, be epoxy resin. Epoxy resin may be deposited by spray to form the protection film 34.

Figure 16:
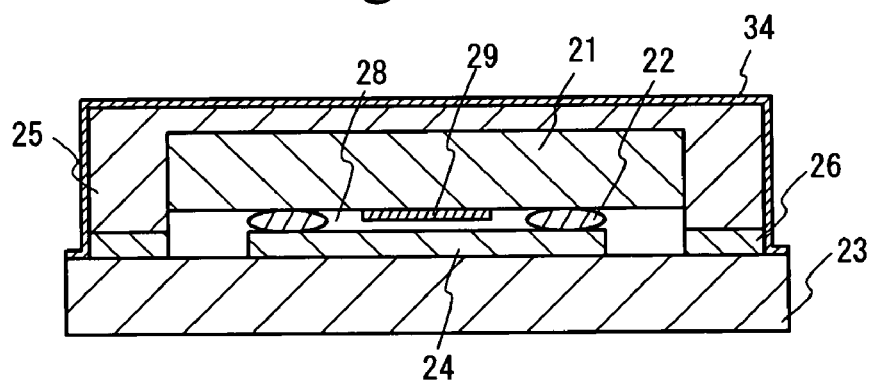
FIG. 16 is a cross-sectional view of another electronic device in accordance with the twelfth embodiment of the present invention, which is a variation of the electronic device in accordance with the second embodiment.

FIG. 16 is a cross-sectional view of an electronic device in which the protection film 34 is applied to the second embodiment shown in FIG. 2. The structure and function of the protection film 34 shown in FIG. 16 are the same as those of the protection film 34 shown in FIG. 15.

Figure 17:
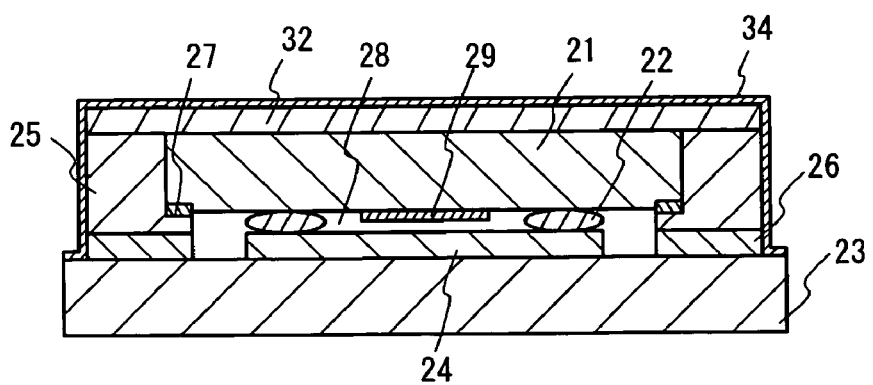
FIG. 17 is a cross-sectional view of yet another electronic device in accordance with the twelfth embodiment of the present invention, which is a variation of the electronic device in accordance with the third embodiment.

FIG. 17 is a cross-sectional view of an electronic device in which the protection film 34 is applied to the third embodiment shown in FIG. 3. The protection film 34 is provided so as to cover the solder seal portion 25, the metal layer 32, the package-side seal pattern 26 and the package substrate 23. The structure and function of the protection pattern shown in FIG. 17 are the same as those of the protection pattern shown in FIG. 15.

Figure 18:
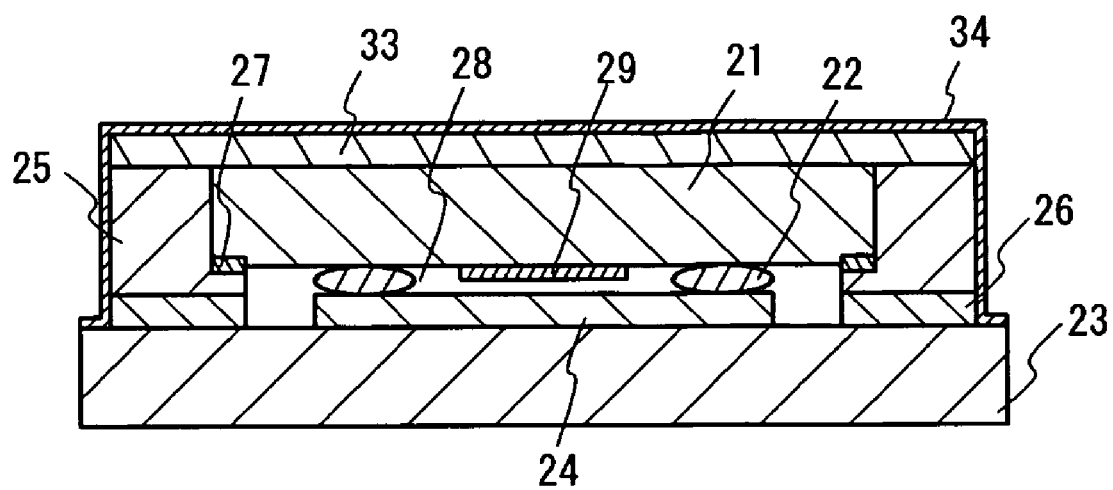
FIG. 18 is a cross-sectional view of a further electronic device in accordance with the twelfth embodiment of the present invention, which is a variation of the electronic device in accordance with the fourth embodiment.

FIG. 18 is a cross-sectional view of an electronic device in which the protection film 34 is applied to the fourth embodiment shown in FIG. 4. The protection film 34 is provided so as to cover the solder seal portion 25, the resin layer 33, the package-side seal pattern 26 and the package substrate 23. The structure and function of the protection pattern shown in FIG. 18 are the same as those of the protection pattern 34 shown in FIG. 15.

Figure 19A:
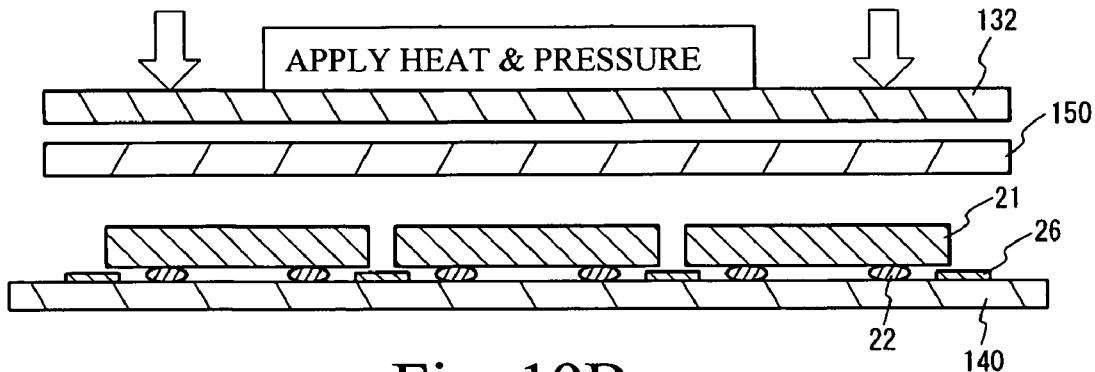
FIGS. 19A through 19D show a method of fabricating the electronic device shown in FIG. 17.
Figure 19B:
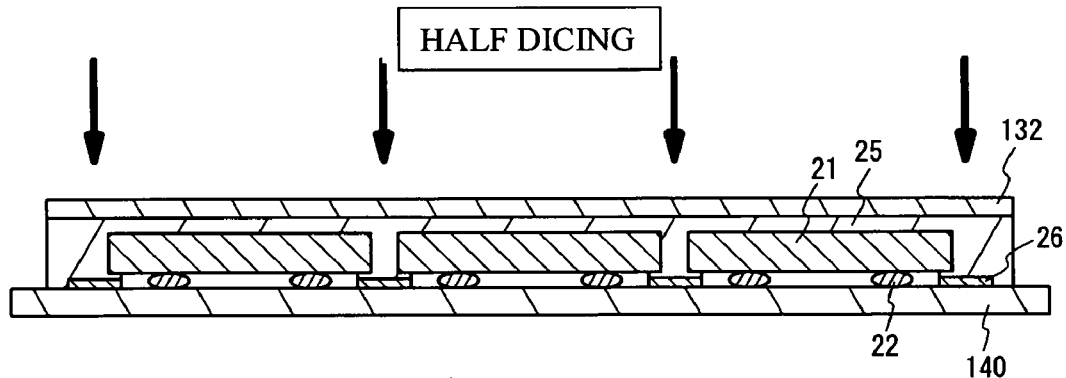
Figure 19C:
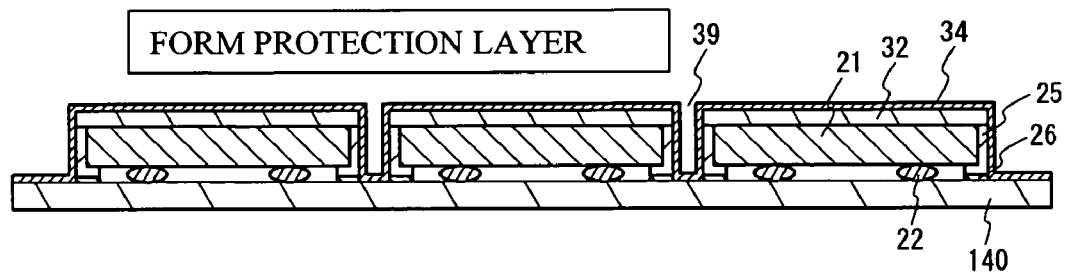
Figure 19D:
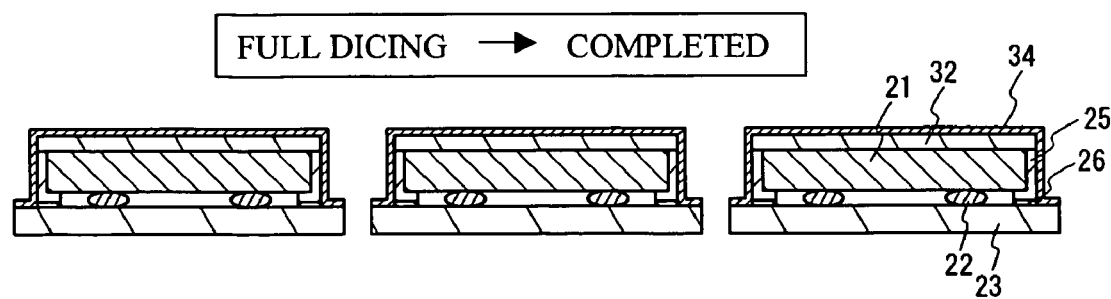

FIGS. 19A through 19D show a process of fabricating the electronic device shown in FIG. 17. The steps of FIGS. 19A and 19B are the same as those shown in FIGS. 5A and 5B, respectively. Referring to FIG. 19C, grooves 19 are formed in the solder portions interposed between the adjacent device chips 21. Next, as shown in FIG. 19C, the protection film 34 is formed. Then, as shown in FIG. 19D, the package substrate 140 is cut into pieces in the same manner as that shown in FIG. 5C. In this manner, multiple electronic devices shown in FIG. 17 are all available at once. Besides the electronic device shown in FIG. 17, the grooves 39 may be provided to electronic devices shown in FIGS. 15 and 16.

Thirteenth Embodiment

Figure 20:
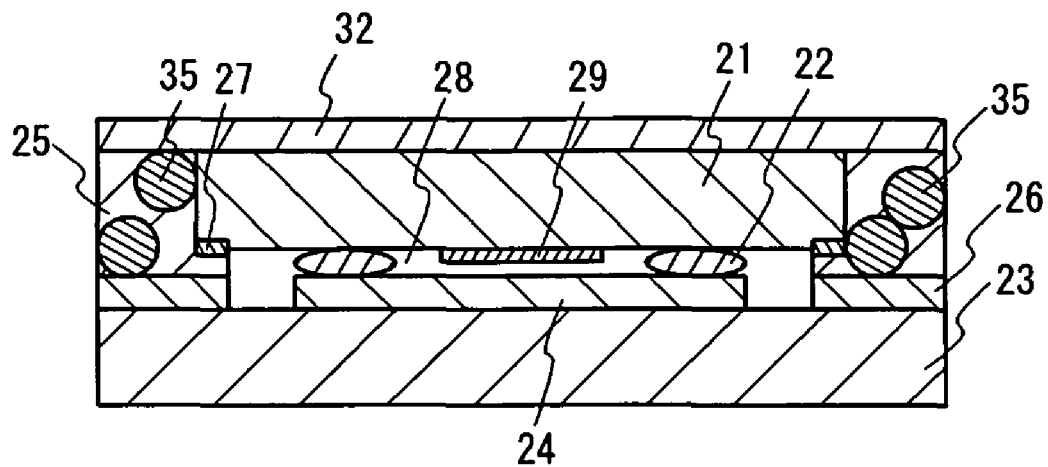
FIG. 20 is a cross-sectional view of an electronic device in accordance with a thirteenth embodiment of the present invention.

FIG. 20 is a cross-sectional view of an electronic device in accordance with a thirteenth embodiment of the present invention. The present electronic device is a variation of the electronic device shown in FIG. 3. Referring to FIG. 20, metal balls 35 coexist in the solder seal portion 25. The metal balls 35 are buried in the sidewalls of the solder seal portion 25. In the structure shown in FIG. 20, the solder seal portion 25 defines the sidewalls of the package, and the metal balls 35 are covered with solder of the solder seal portion 25. The metal balls 35 may be Cu balls having a diameter of 0.15 mm. The surfaces of the Cu balls are plated with Sn. The solder seal portion 25 may be made of Sn—Ag. At the interfaces of the metal balls 35, a Sn—Cu based compound is produced to form a high-melting-point layer. The heat-resistant characteristic obtained when the metal balls 35 are used is superior to that obtained in the absence of the metal balls 35. It has been confirmed that Ni balls bring about the same functions and effects as those of Cu balls. The use of the metal balls 35 additionally brings about reduction in the volume of solder. This contributes to cost reduction, particularly when expensive solder such as Au—Sn solder is used for the solder seal portion 25.

Figure 21:
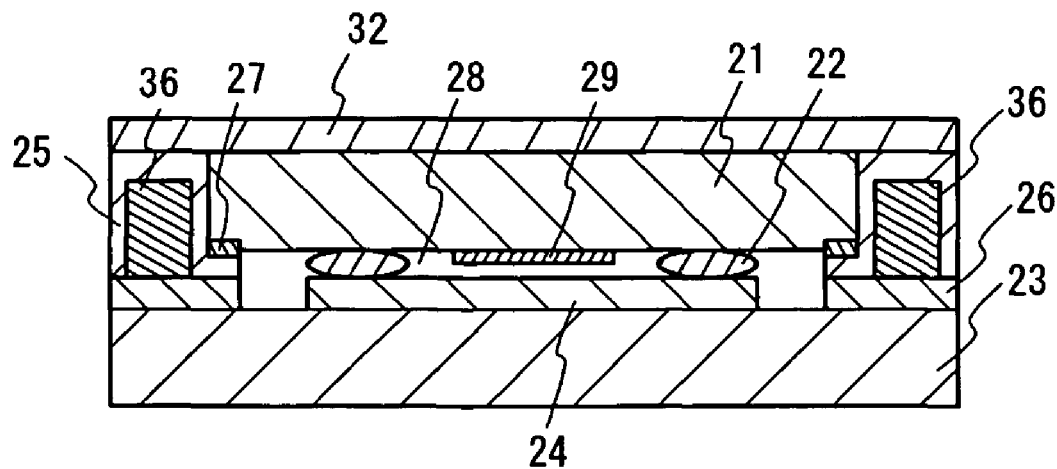
FIG. 21 is a cross-sectional view of a variation of the electronic device in accordance with the thirteenth embodiment of the present invention.

FIG. 21 is a cross-sectional view of an electronic device in which a metal frame 36 is substituted for the metal balls 35. The metal frame 36 is covered with solder of the solder seal portion 25. The metal frame 36 is buried in the sidewalls of the solder seal portion 25. The metal frame 36 is positioned on the package-side seal pattern 26. The metal frame 36 is formed so as to surround the device chip 21. Preferably, the metal frame 36 may be made of a material having good wettability to solder, such as kovar. Alternatively, a material having a poor wettability to solder may be applied to the metal frame 36. In this case, the material may be subjected to surface treatment. The metal frame 36 brings about the functions and effects similar to those of the metal balls 35.

The metal balls 35 and the metal frame 36 is not limited to the structure shown in FIG. 3 but may be applied to the electronic devices shown in FIGS. 1, 2 and 4 and those shown in FIGS. 15 through 18.

Figure 22A:
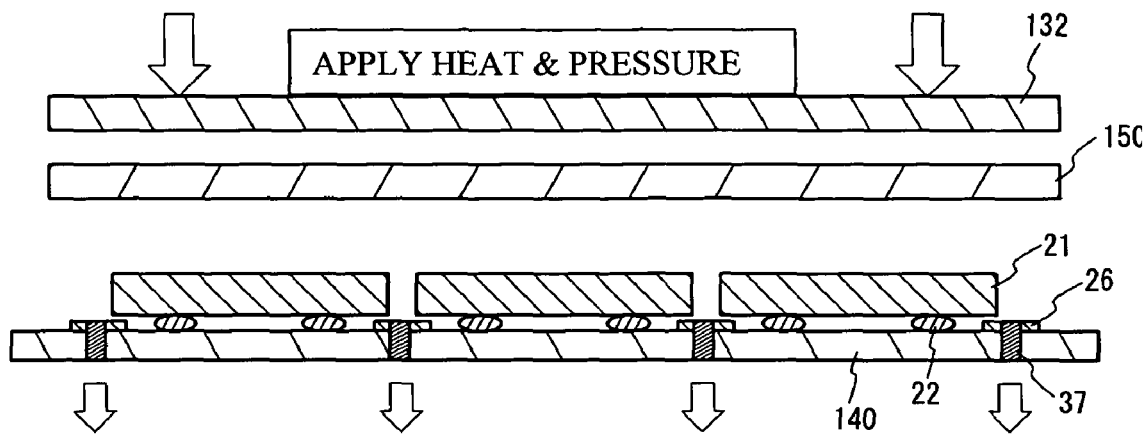
FIGS. 22A through 22C show a process of fabricating the electronic device shown in FIG. 21.
Figure 22B:
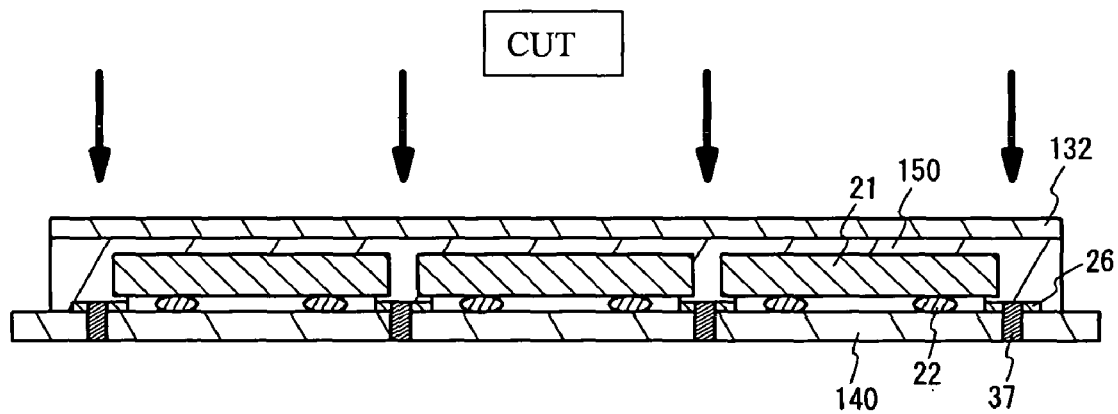
Figure 22C:
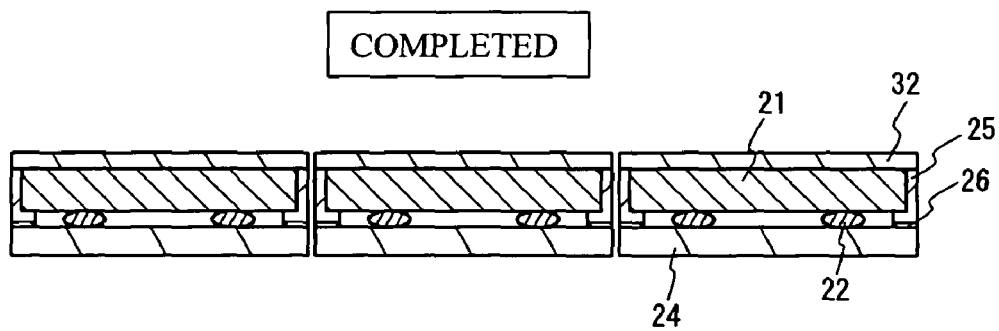

FIGS. 22A through 22C show a process of fabricating the electronic device shown in FIG. 21. Referring to FIG. 22A, through holes 37 are formed in the multiple package substrate 140. A single or multiple through holes 37 may be formed between the neighboring device chips 21. The through holes 37 function to facilitate discharging of surplus air to the outside of the device when the solder sheet 150 supplied from the upper surfaces of the device chips 21 together with the metal layer 132 are heated and pressurized. Then, as shown in FIG. 22B, the package substrate 140 is cut into pieces by the dicer, so that multiple electronic devices are all available at once, as shown in FIG. 22C. It has been confirmed that the through holes 37 greatly improve the yield of the electronic devices having an outside dimension of 1.4 mm×1.0 mm.

The present invention is not limited to the specifically disclosed embodiments, but other embodiments and variations may be made without departing from the scope of the present invention.

The present invention is based on Japanese Patent Application No. 2004-374596 filed Dec. 24, 2004 and Japanese Patent Application No. 2005-056722 filed Mar. 1, 2005, the entire disclosure of which is hereby incorporated by reference.

What is claimed is:

1. An electronic device comprising:
a package substrate made of an insulator;
a device chip that is flip-chip mounted on the package substrate through a bump;
a seal portion sealing the device chip;
a metal or resin layer being provided on a top surface of the seal portion, the entire metal or resin layer having a flat plate shape; and
the seal portion including sidewalls that are made of solder and define at least a part of an outer shape of the electronic device, a protection film being formed in contact with side surfaces of the sidewalls and having a melting point higher than the solder, the protection film having exposed outermost side surfaces of the electronic device and being isolated from the bump,
the device chip contacting the sidewalls made of solder,
a side surface of the metal or resin layer, a side surface of the sidewalls and a side surface of the package substrate forming an identical flat surface.

2. The electronic device as claimed in claim 1, wherein the whole seal portion including the sidewalls is made of solder.

3. The electronic device as claimed in claim 1, wherein:
the sidewalls of the seal portion define a cavity in which the device chip is mounted.

4. The electronic device as claimed in claim 1, further comprising first and second metal patterns respectively provided on a peripheral portion of the package substrate and a peripheral portion of the device chip, wherein:
the second metal pattern overlaps with a part of the first metal pattern; and
the sidewalls made of solder contact the first and second metal patterns.

5. The electronic device as claimed in claim 1, further comprising a metal pattern on a peripheral portion of the package substrate, the sidewalls made of solder contacting the metal pattern.

6. The electronic device as claimed in claim 1, further wherein the protection film covers the seal portion and the metal or resin layer.

7. The electronic device as claimed in claim 1, wherein the protection film is one of a metal film and a resin film.

8. The electronic device as claimed in claim 1, wherein the sidewalls made of solder include metal balls buried therein.

9. The electronic device as claimed in claim 1, wherein the sidewalls made of solder include a frame buried therein.

10. A method of fabricating an electronic device, the method comprising the steps of:
flip-chip mounting multiple device chips on a package substrate through bumps;
supplying solder to at least one of the package substrate and each of the multiple device chips and heating the solder to be melted so that a seal portion made of solder is formed on the package substrate so as to cover the multiple device chips;
cutting the seal portion and the package substrate into multiple seal portions and multiple package substrates so that each of the multiple seal portions includes sidewalls that are made of solder and define at least a part of an outer shape of the electronic device, the sidewalls being isolated from the bumps; and
forming a protection film in contact with side surfaces of the sidewalls that is made of metal and has a melting point higher than the solder, the protection film being exposed outermost side surface of the electronic device;
each of the device chips contacting the sidewalls made of solder, wherein the step of supplying solder comprises a step of supplying a solder sheet on top surfaces of the multiple device chips and heating, a step of supplying a metal or resin layer on the solder sheet, the entire metal or resin layer having a flat plate shape, and a step of pressurizing the solder sheet by using the metal or resin layer; and
the step of cutting the seal portion and the step of cutting the metal or resin layer are performed simultaneously so that a side surface of the metal or resin layer, a side surface of the sidewalls and a side surface of the package substrate form an identical flat surface.

11. A method of fabricating an electronic device, the method comprising the steps of:
flip-chip mounting multiple device chips on a package substrate through bumps;
supplying solder to at least one of the package substrate and each of the device chips and heating the solder to be melted so that a seal portion made of solder is formed on the package substrate so as to cover the multiple device chips;
cutting the seal portion and the package substrate into multiple seal portions and multiple package substrates so that each of the multiple seal portions includes sidewalls that are made of solder and define at least a part of an outer shape of the electronic device, the sidewalls being isolated from the bumps; and
forming a protection film in contact with side surfaces of the sidewalls that is made of metal and has a melting point higher than the solder, the protection film having exposed outermost side surface of the electronic device;

each of the device chips contacting the sidewalls made of solder, wherein the step of supplying solder comprises steps of:

heating the package substrate;

supplying a solder sheet on top surfaces of the multiple device chips; and supplying a metal or resin layer on the solder sheet, the entire metal or resin layer having a flat plate shape; and pressurizing the solder sheet by using the metal or resin layer, wherein the step of cutting the seal portion and the step of cutting the metal or resin layer are performed simultaneously so that a side surface of the metal or resin layer, a side surface of the sidewalls and a side surface of the package substrate form an identical flat surface.

12. A method of fabricating an electronic device, the method comprising the steps of:

flip-chip mounting multiple device chips on a package substrate through bumps;

supplying solder to at least one of the package substrate and each of the multiple device chips and heating the solder to be melted so that a seal portion made of solder is formed on the package substrate so as to cover the multiple device chips;

cutting the seal portion and the package substrate into multiple seal portions and multiple package substrates so that each of the multiple seal portions includes sidewalls that are made of solder and define at least a part of an outer shape of the electronic device, the sidewalls being isolated from the bumps; and forming a protection film in contact with side surfaces of the sidewalls that is made of metal and has a melting point higher than the solder, the protection film having exposed outermost side surface of the electronic device, each of the multiple device chips contacting the sidewalls made of solder, wherein the step of supplying solder comprises steps of:

supplying a solder sheet on top surfaces of the multiple device chips;

supplying a metal or resin layer on the solder sheet, the entire metal or resin layer having a flat plate shape;

pressurizing the solder sheet by using the metal or resin layer; and reflowing the solder sheet, wherein the step of cutting the seal portion and the step of cutting the metal or resin layer are performed simultaneously so that a side surface of the metal or resin layer, a side surface of the sidewalls and a side surface of the package substrate form an identical flat surface.

13. A method of fabricating an electronic device, the method comprising the steps of:

flip-chip mounting multiple device chips on a package substrate through bumps;

supplying solder to at least one of the package substrate and each of the multiple device chips and heating the solder to be melted so that a seal portion made of solder is formed on the package substrate so as to cover the multiple device chips;

cutting the seal portion and the package substrate into multiple seal portions and multiple package substrates so that each of the multiple seal portions includes sidewalls that are made of solder and define at least a part of an outer shape of the electronic device, the sidewalls being isolated from the bumps; and forming a protection film in contact with side surfaces of the sidewalls that is made of metal and has a melting point higher than the solder, the protection film having exposed outermost side surface of the electronic device, each of the multiple device chips contacting the sidewalls made of solder, wherein the step of supplying solder comprises steps of:

supplying solder paste on top surfaces of the multiple device chips;

supplying a metal or resin layer on the solder paste, the entire metal or resin layer having a flat plate shape;

pressurizing the solder paste by using the metal or resin layer; and reflowing the solder paste, wherein the step of cutting the seal portion and the step of cutting the metal or resin layer are performed simultaneously so that a side surface of the metal or resin layer, a side surface of the sidewalls and a side surface of the package substrate form an identical flat surface.

* * * * *